April 21, 1959 H. R. CAMP 2,883,591

SEMICONDUCTOR RECTIFIER DEVICE

Filed Oct. 4, 1954

3 Sheets-Sheet 1

WITNESSES:
E. A. McCloskey.
Wm. L. Groome

INVENTOR
Henry R. Camp.
BY F. P. Lyle
ATTORNEY

April 21, 1959

H. R. CAMP 2,883,591

SEMICONDUCTOR RECTIFIER DEVICE

Filed Oct. 4, 1954

3 Sheets-Sheet 2

April 21, 1959 H. R. CAMP 2,883,591

SEMICONDUCTOR RECTIFIER DEVICE

Filed Oct. 4, 1954 3 Sheets-Sheet 3

United States Patent Office 2,883,591

Patented Apr. 21, 1959

2,883,591

SEMICONDUCTOR RECTIFIER DEVICE

Henry R. Camp, Wilkins Township, Allegheny County, Pa., assignor to Westinghouse Electric Corporation, East Pittsburgh, Pa., a corporation of Pennsylvania Application October 4, 1954, Serial No. 460,163

5 Claims. (Cl. 317—234)

The present invention relates to semiconductor devices and more particularly to improved cooling means for such devices.

The invention is especially applicable to semi-conductor rectifier devices of the p-n junction type, although its usefulness is not necessarily limited to this specific application and it may also be used for other types of semiconductor devices. Semiconductor materials, such as germanium and silicon, may exist in either of two conductivity types, depending upon the treatment of the material and the presence of extremely small amounts of certain impurities. N-type material is characterized by an excess of electrons and its conductivity is due to the presence of these electrons. P-type material is characterized by a deficiency of electrons in the crystal structure of the material, resulting in so-called holes, and the conductivity of the material is due to an apparent movement of these holes, which act like positive charges. If a body of semiconductor material has adjoining zones of n-type and p-type material, the junction between the two zones acts as a rectifying barrier or layer, since it permits current to flow freely from the p-type material to the n-type material, but presents a very high resistance to current flow in the reverse direction, so that only an extremely small leakage current can flow.

These p-n junction rectifying devices have very desirable characteristics since they can carry currents of high current density in the forward direction and are capable of withstanding relatively high reverse voltages. These devices, therefore, are very suitable for use as power rectifiers, and can handle relatively large amounts of power if the junction is made of sufficient area. In order to obtain high power ratings, however, it is necessary to provide very effective means for dissipating the heat generated in the device. The leakage currents are extremely small, as indicated above, so that only a negligible amount of heat is generated by the reverse current, but the forward currents may be quite high, of the order of several hundred amperes, and even though the forward voltage drop is quite low a considerable amount of heat is generated. Since these devices are of relatively small physical size, the heat is concentrated in a very small volume of material and unless it is effectively dissipated, the temperature of the material would become very high. These semiconductor devices have rather definite temperature limits, however, which are approximately 65° C. for germanium and of the order of 200° C. for silicon. If the material is allowed to exceed these temperatures, the leakage current increases very rapidly and the device loses its rectifying characteristics and is likely to be permanently damaged or destroyed by the resultant overheating. In order to obtain high power ratings, therefore, without exceeding the permissible maximum temperatures, it is necessary to provide very effective cooling means for dissipating the heat generated in the rectifier.

The principal object of the present invention is to provide means for effectively cooling semiconductor devices to permit high current or power ratings.

Another object of the invention is to provide means for cooling semiconductor devices of the p-n junction type by vaporization of a suitable liquid which is maintained in heat exchange relation with the semiconductor device.

A further object of the invention is to provide a power rectifier in which a semiconductor rectifier device of the p-n junction type is supported in heat exchange relation with a vaporizable liquid which is evaporated by the heat generated in the rectifier device, thus cooling the device, together with means for condensing the vaporized liquid for reuse.

Other objects and advantages of the invention will be apparent from the following detailed description, taken in connection with the accompanying drawing, in which.

Figure 1:
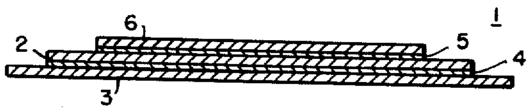
Figure 1 is a sectional view of a typical semiconductor rectifier device.

As indicated above, the present invention may be applied to the cooling of semiconductor devices of any type, but is especially suitable for power rectifiers of the p-n junction type, and is shown in the drawing as applied to a device of this type. A typical power rectifier of the p-n junction type is shown in section in Fig. 1, the thicknesses of the various components of the device being greatly exaggerated in the drawing for clarity of illustration. The rectifier device or cell 1 shown in Fig. 1 consists of a body of semiconductor material 2, which may be either germanium or silicon, and which is preferably in the form of a thin wafer. The semiconductor body 2 is mounted on a metal plate 3 by means of a thin layer of solder 4, which forms an ohmic contact and secures the semiconductor to the plate with a permanent joint of good electrical and thermal conductivity.

The semiconductor material 2 is preferably n-type material and the rectifying junction is formed by applying a layer of a so-called acceptor impurity material 5 which is capable of converting the semiconductor material to p-type. Indium is a suitable material for this purpose if the semiconductor is germanium, while aluminum is preferably used with silicon. The acceptor material 5 alloys with the surface layer semiconductor material and diffuses into it, so that a portion of the semiconductor material is converted to p-type material, thus forming a p-n rectifying junction. A metal terminal plate 6 is applied to the acceptor material 5 and is bonded to it with a permanent joint of good thermal and electrical conductivity. The terminal plates 3 and 6 are required for mechanical support of the relatively fragile semiconductor material and to provide for electrical contact to it, and are preferably made of molybdenum because of its relatively good thermal conductivity and because its thermal expansion is close to that of both germanium and silicon.

As previously explained, a semiconductor rectifier device, such as that shown in Fig. 1, is capable of handling relatively large amounts of power but must be effectively cooled to dissipate the heat generated in the small volume of semiconductor material to prevent the temperature of the material from exceeding the maximum permissible value.

Figure 2:
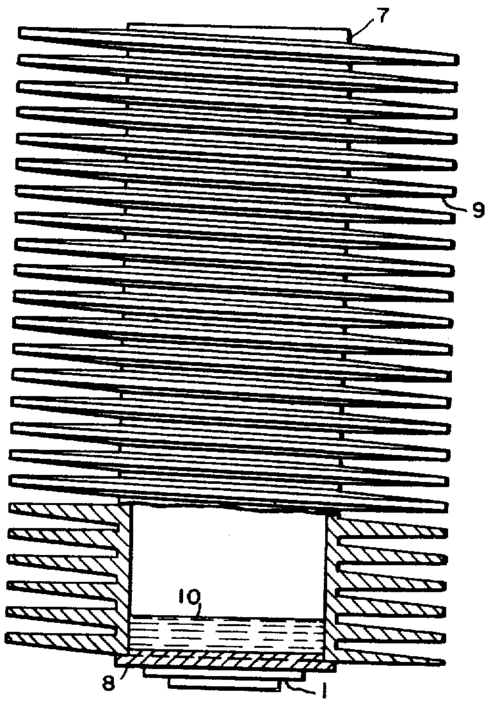
Fig. 2 is a view in elevation, and partly in vertical section, showing a simple illustrative embodiment of the invention.

Fig. 2 shows a simple illustrative embodiment of the present invention for effectively dissipating the heat from a semiconductor device. The structure shown in Fig. 2 comprises a closed container 7, which is hermetically sealed and which may comprise a cylindrical hollow body of copper, or other material of good thermal conductivity, closed at the top and provided with a bottom plate 8, preferably also of copper, brazed or otherwise secured to the body with an airtight seal. The container 7 has heat radiating means on its outer surface, preferably consisting of helical fins 9 which may be formed integral with the container. A suitable quantity of vaporizable liquid 10 partially fills the container 7 in contact with the copper bottom plate 8, and the container may be partially evacuated, if necessary, to cause the liquid 10 to boil at a desired temperature.

In the illustrated embodiment, a semiconductor rectifier cell 1, which may be of the type shown in Fig. 1, is mounted on the plate 8 on the outside of the container 7, one of the terminal plates of the rectifier cell being soldered to the plate 8 with a connection of good thermal conductivity. The liquid 10 contained in the container 7 may be any suitable liquid which boils at a temperature not exceeding the maximum temperature which the rectifier cell 1 is to be allowed to obtain. Water, for example, may suitably be used because of its high latent heat of vaporization which provides a very strong cooling effect, the pressure in the container 7 being adjusted to obtain the desired boiling point of the water.

It will be seen that when the rectifier 1 is carrying current, the heat generated in the rectifier will flow through the copper plate 8 to the liquid 10 and heat the liquid. When the boiling point of the liquid is reached, it will boil violently and be vaporized, thus absorbing an amount of heat equivalent to its latent heat of vaporization. The vapor generated in the boiling liquid rises in the container 7 and upon striking the relatively cool walls of the container, it is condensed and gives up its heat to the wall of the container from which it is radiated by the fins 9, the condensed liquid returning to the bottom of the container. A current of cooling air may, if desired, be forced over the outside of the container to assist in dissipating the heat from the fins 9. It will be seen that very effective cooling of the rectifier 1 can be obtained in this way, since the liquid 10 will absorb a relatively large amount of heat and the vaporization of the liquid tends to limit the temperature of the rectifier to a substantially constant value determined by the boiling point of the liquid.

The simple embodiment of the invention shown in Fig. 2 has certain disadvantages. Thus, the rectifier 1 is not in direct contact with the liquid 10 and the effectiveness of the cooling is somewhat impaired by the temperature drop across the plate 8 between the rectifier 1 and the liquid 10. Furthermore, these semiconductor devices are quite sensitive to moisture and must be completely protected against moisture. In the device of Fig. 2, therefore, the rectifier 1 must be encapsulated, or shielded in some other way against atmospheric moisture, and it is also in a somewhat exposed position where it may be subject to accidental damage. A more desirable arrangement, therefore, would be to place the rectifier cell within the container 7 in direct contact with the vaporizable liquid, so that the most effective heat transfer is obtained, and so that the cell will be protected against moisture within the hermetically sealed container.

When the rectifier cell is placed within the container 7, water cannot be used as the vaporizable liquid unless it is highly distilled, to be extremely pure, and unless means are provided for neutralizing any ions present in the water, to make it non-conductive. This makes the use of water somewhat impractical but other suitable liquids are available. It has been found that the highly fluorinated liquid organic compounds which contain no hydrogen possess very desirable properties for this purpose. These materials, in general, are extremely inert chemically and are free of moisture, so that they have no adverse effect on the characteristics of the rectifier, and they are insulating liquids of high dielectric strength and have relatively high latent heat of vaporization. For example, with germanium rectifiers, it has been found that trichlorotrifluoroethane (available commercially under the name Freon 113) is a very suitable material, since it has a boiling point of 47° C. at atmospheric pressure and has the other properties described above. For silicon rectifiers, materials of higher boiling point are desirable, and it has been found that perfluorotributylamine, with a boiling point of 177° C. at atmospheric pressure, and perfluoroether, with a boiling point of 101° C. at atmospheric pressure, are very suitable. Any other suitable liquids may be used, however, having boiling points in the desired range and having good insulating properties and chemical inertness, with a sufficiently high latent heat of vaporization to produce the desired cooling effect.

Figure 3:
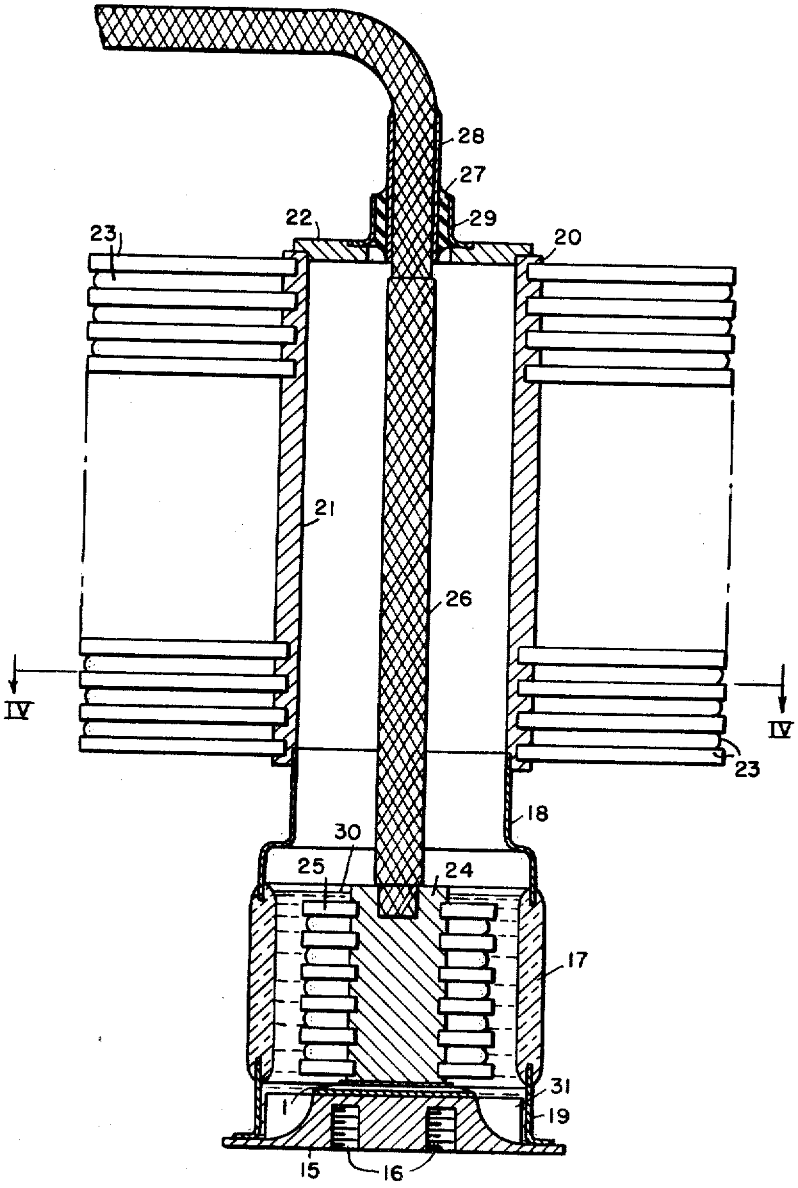
Fig. 3 is a view in vertical section showing another embodiment of the invention.

Fig. 3 shows an embodiment of the invention in which the rectifier cell is disposed within the sealed container and in which additional radiating surface is provided on the rectifier itself. In this arrangement, a rectifier cell 1, which may be of the construction shown in Fig. 1, is placed within a sealed container which has a metal base plate 15, preferably of copper, on which the rectifier cell is mounted, preferably by soldering one of the terminal plates of the cell to the plate 15. The base plate 15 may have tapped holes 16 formed in it for mounting the device and for connection of electrical leads to one side of the rectifier. The container includes a glass cylinder 17 with metal sleeve members 18 and 19 fused to the glass, the members 18 and 19 being made of a suitable alloy which forms a permanent airtight seal with the glass. The lower sleeve member 19 is brazed or otherwise secured to the base plate 15 with an airtight joint. The container also includes a radiator member 20 which is brazed or otherwise joined to the upper sleeve member 18 with an airtight joint.

The radiator member 20 consists of a tubular metal body 21, preferably of copper, closed at the top by a plate 22 sealed to the body 21 with a hermetic seal. Radiating means are provided on the outer surface of the body 21. In the illustrative embodiment, the radiating means consists of fins 23 of the pin type. As more clearly shown in Fig. 4, these fins 23 consist of a plurality of pins or rod-like members secured in the body 21 and extending radially outward, the pins of successive rows being staggered as clearly shown in the drawing. It will be understood that radial or helical fins may be used if desired, but the pin type fins are advantageous because they substantially increase the radiating area over that obtainable with radial fins of the usual type, while the staggering of the pins increases the turbulence of air flow over them, which materially increases the rate of heat transfer.

In order to increase the radiating surface of the rectifier itself, a conducting member 24, which may be a cylindrical copper block, is soldered to the upper terminal plate of the rectifier cell 1 and is provided with fins 25, which may also be of the pin type to obtain the advantages previously mentioned, although other types of fins could be utilized. A flexible conductor 26 is secured in the copper block 24 to provide for electrical connection to the upper side of the rectifier cell. The conductor 26 extends up through the radiator member 20 and through the plate 22. The conductor 26 is insulated from the plate 22 and a hermetic seal provided by any suitable means, such as a glass bushing 27 fused to an inner sleeve 28 and an outer sleeve 29, of a suitable alloy, which are soldered or otherwise hermetically joined to the conductor 26 and the plate 22, respectively.

The container is partially filled with a vaporizable liquid 30, which may be any of the liquids mentioned above or other suitable liquid, and which fills the container to a depth sufficient to cover the rectifier cell 1 and the fins 25, so that the rectifier and fins are submerged in the liquid. It will be seen that when the rectifier 1 is carrying current, heat generated in the rectifier cell directly heats the liquid in contact with it to cause vaporization of the liquid to absorb heat from the rectifier cell. The copper block 24 and fins 25 increase the heat dissipating area in contact iwth the liquid, so that very effective heat transfer is obtained and the temperature of the rectifier cell is limited to a value not exceeding the boiling point of the liquid. The container is, of course, evacuated before the liquid 30 is introduced and is then finally sealed, the pressure within the container due to the vapor of the liquid determining the boiling point of the liquid. The vapor boiled off from the liquid 30 rises in the radiator 20 and is condensed on the walls of the radiator, where the heat is transferred to the fins 23 from which it is radiated to the air. A current of cooling air may be blown over the radiator 20, if desired, to increase the rate of heat transfer.

It will be understood that various modifications of this construction are possible. Thus, if desired, the edge of the rectifier cell 1 might be coated with a thin film of a suitable dielectric material to protect the fragile junction from a possible abrasive action of the bubbles of vapor formed in the liquid, which boils violently during operation. The radiating surface exposed to the liquid 30 may also be increased by providing fins 31 on the base plate 15 within the container, thus improving the transfer of heat from the rectifier cell to the liquid on both sides of the junction.

Figures 4, 5, 6:
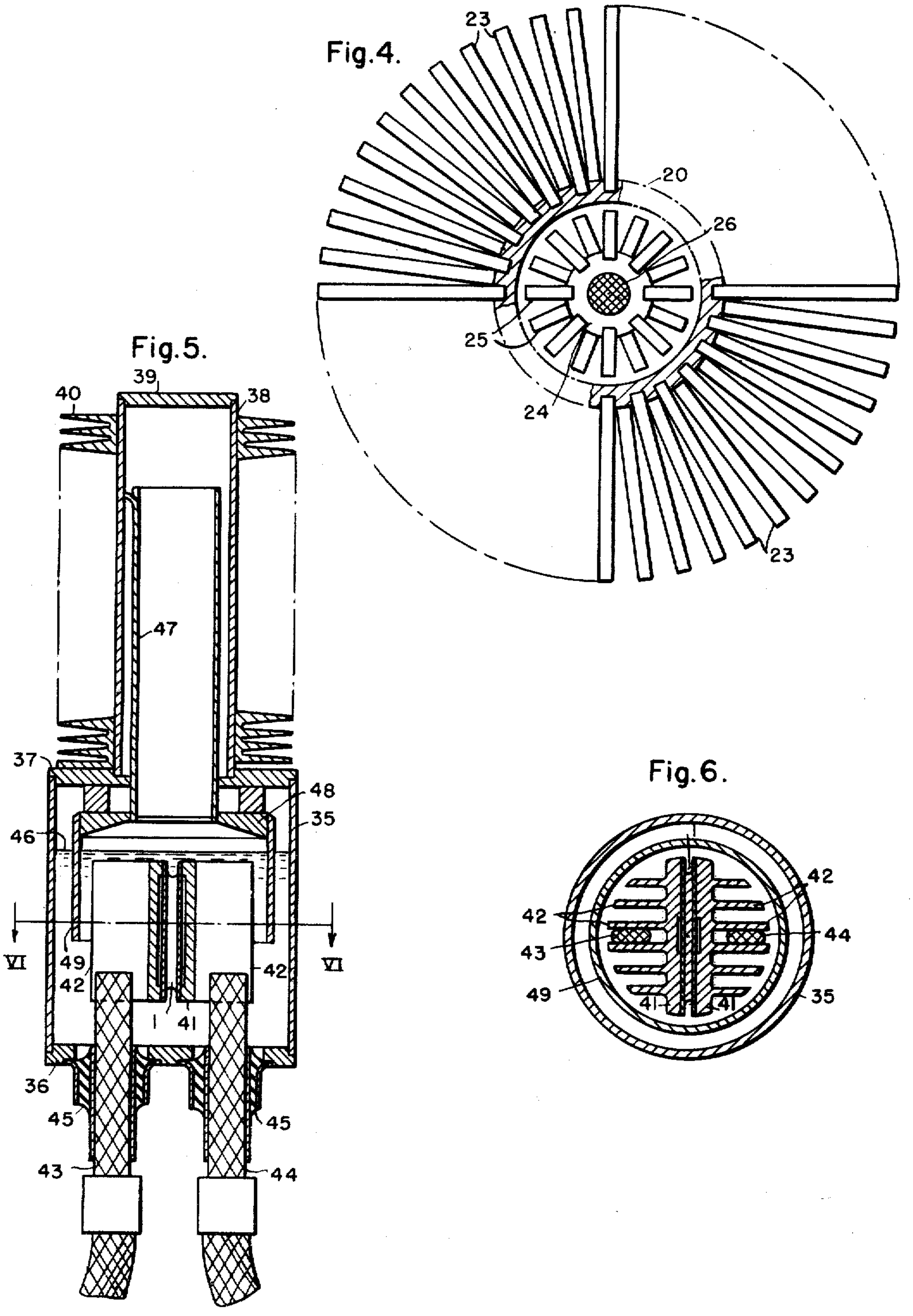
Fig. 4 is a transverse sectional view, approximately on the line IV—IV of Fig. 3.
Fig. 5 is a vertical sectional view showing still another embodiment of the invention.
Fig. 6 is a transverse sectional view approximately on the line VI—VI of Fig. 5.

Another embodiment of the invention is shown in Figs. 5 and 6. In this construction, the rectifier cell 1, which may be of the type previously described, is supported vertically within a sealed container and provision is made for large heat radiating surface on both sides of the cell. In this construction, the closed container includes a cylindrical metal chamber 35, preferably of copper, closed at the bottom by a bottom plate 36 and at the top by a top plate 37, which are brazed or otherwise secured to the chamber 35 with airtight joints. A radiator member 38 is secured in the top plate 37 with an airtight joint and communicates with the chamber 35 to form part of the container. The radiator 38 may be a hollow tubular member, preferably of copper, closed at the top by a plate 39 hermetically sealed to the radiator, and provided with fins 40 on its outer surface. The fins 40 are shown as being generally helical fins, but it will be understood that pin type fins might be used, if desired, as described above in connection with Fig. 3, or any other means for increasing the radiating surface could be used.

The rectifier cell 1 is disposed vertically in the chamber 35 and is provided with a plurality of fins on each side. As more clearly shown in Fig. 6, each of the terminal plates of the rectifier cell has soldered to it a copper plate 41 with a plurality of fins 42 extending outwardly from it Terminal leads 43 and 44 are soldered or brazed to fins 42 on opposite sides of the rectifier cell 1 to provide for electrical connection, and the leads 43 and 44 support the rectifier in position and extend out of the container through the bottom plate 36, the conductors being insulated from the plate and sealed thereto with air-tight seals by glass bushings 45 of the type described above in connection with Fig. 3. Thus, the rectifier cell is firmly held in position in the chamber 35 and the supporting means also serves as terminal means for electrical connection.

The container, consisting of the chamber 35 and radiator 38, is partially filled with a suitable vaporizable liquid 46, which may be any of the liquids previously mentioned or other suitable liquid, and which fills the chamber 35 to a depth sufficient to cover the rectifier 1 and fins 42. It will be evident that when the rectifier is carrying current, the heat generated will flow through the fins as well as directly from the cell to the liquid, causing the liquid to boil and be vaporized to absorb the heat. The vapor from the boiling liquid rises into the radiator 38 where it is condensed on the relatively cool wall of the radiator, and the condensed liquid returns to the chamber 35.

In this embodiment of the invention there is also shown a vapor baffle 47 for separating the rising vapor from the condensed liquid returning to the chamber 35. The baffle 47 is a tubular member disposed coaxially of the radiator 38 and is supported on a ring 48 mounted on the top plate 37 of the chamber 35. A lower baffle 49 preferably extends downward from the ring 48 around the fins 42 and rectifier 1 to direct the rising vapor into the radiator 38. The vapor baffles tend to separate the flow of the rising vapor from the falling condensed liquid to produce a more natural evaporating cycle and thus somewhat improve the cooling effect. It will be understood that, if desired, a similar vapor baffle could be employed in the construction of Fig. 3.

It will be obvious that various modifications of the specific constructions shown may be made and that other embodiments are possible within the scope of the invention. Thus, any type of radiating means or fins may be used on the rectifier cell and on the outer surface of the radiator members to increase the radiating surface. The radiators may be disposed in communication with the closed container in any desired manner, and where a relatively large volume of vapor is involved, or where considerations of available space make it desirable, a plurality of horizontally disposed radiators might be used communicating with a central chamber of the type shown in Fig. 5 containing the liquid and rectifier cell. Other modifications and embodiments will be apparent and it is to be understood, therefore, that although certain specific embodiments of the invention have been described for the purpose of illustration, it is not limited to the particular structural features shown but includes all equivalent embodiments and modifications.

I claim as my invention:

1. In combination, a hermetically sealed container, a semi-conductor device disposed in said container, said semi-conductor device having a definite maximum operating temperature limit, and a vaporizable liquid having a boiling point not greater than the maximum operating temperature of said semi-conductor device partially filling the container and covering the semi-conductor device for maintaining the temperature of said semiconductor device within the maximum operating temperature limit of said semi-conductor device, said vaporizable material comprising a highly fluorinated liquid organic compound.

2. In combination, a hermetically sealed container, a germanium device disposed in said container, said germanium device having a definite maximum operating temperature limit, and a vaporizable liquid having a boiling point not greater than the maximum operating temperature limit of said germanium device partially filling the container and covering said germanium device for maintaining the temperature of said germanium device within the maximum operating temperature limit of said germanium device, said vaporizable material comprising trichlorotrifluoroethane.

3. In combination, a hermetically sealed container, a germanium device disposed in said container and attached to one wall of said container, said germanium device having a definite maximum operating temperature limit, a metal member having fins thereon attached to said germanium device, and a vaporizable liquid having a boiling point not greater than the maximum operating temperature of said germanium device partially filling the container and covering the germanium device and said metallic member having fins for maintaining the temperature of said germanium device within the maximum operating temperature limit of said germanium device, said vaporizable material comprising trichlorotrifluoroethane.

4. In combination, a hermetically sealed container, a silicon device disposed in said container, said silicon device having a definite maximum operating temperature limit, and a vaporizable liquid having a boiling point not greater than the maximum operating temperature limit of said silicon device partially filling the container and covering the germanium device to maintain the temperature of said germanium device within the maximum operating temperature limit of said silicon device, said vaporizable material comprising perfluorotributylamine.

5. In combination, a hermetically sealed container, a silicon device disposed in said container, said silicon device having a definite maximum operating temperature limit, and a vaporizable liquid having a boiling point not greater than the maximum operating temperature of said silicon device partially filling the container and covering said silicon device for maintaining the temperature of said silicon device within the maximum operating temperature limit of said silicon device, said vaporizable material comprising perfluoroether.

References Cited in the file of this patent

UNITED STATES PATENTS

| | | |
|---|---|---|
| 2,189,617 | Siebert | Feb. 6, 1940 |
| 2,288,341 | Addink | June 30, 1942 |
| 2,345,499 | Peter | Mar. 28, 1944 |
| 2,430,904 | Baldingh | Nov. 18, 1947 |

FOREIGN PATENTS

| | | |
|---|---|---|
| 823,765 | Germany | Dec. 6, 1951 |
| 1,050,940 | France | Jan. 12, 1954 |
| 87,896 | Sweden | Nov. 17, 1956 |

UNITED STATES PATENT OFFICE

CERTIFICATE OF CORRECTION

Patent No. 2,883,591 April 21, 1959

Henry R. Camp

It is hereby certified that error appears in the printed specification of the above numbered patent requiring correction and that the said Letters Patent should read as corrected below.

Column 7, lines 10 and 11, for "germanium", each occurrence, read -- silicon --.

Signed and sealed this 6th day of October 1959.

(SEAL)
Attest:

KARL H. AXLINE
Attesting Officer

ROBERT C. WATSON
Commissioner of Patents

Notice of Adverse Decision in Interference

In Interference No. 90,499 involving Patent No. 2,883,591, H. R. Camp, Semiconductor rectifier device, final judgment adverse to the patentee was rendered May 16, 1962, as to claims 1 and 2.

[*Official Gazette December 4, 1962.*]